United States Patent [19]
Tokuno et al.

[11] Patent Number: 5,686,763
[45] Date of Patent: Nov. 11, 1997

[54] DEVICE MODULE COMPRISING A SUBSTRATE HAVING GROOVES FIXED TO CIRCUIT CHIPS WITH IMPROVED SEALING CHARACTERISTICS

[75] Inventors: Kenichi Tokuno; Manabu Bonkohara, both of Tokyo, Japan

[73] Assignee: NEC Corporation, Tokyo, Japan

[21] Appl. No.: 534,940

[22] Filed: Sep. 28, 1995

[30] Foreign Application Priority Data

Sep. 28, 1994 [JP] Japan .................................. 6-232733

[51] Int. Cl.$^6$ .................................................. H01L 23/31
[52] U.S. Cl. .......................... 257/777; 257/778; 257/786; 257/787
[58] Field of Search ........................... 257/773, 777, 257/778, 786, 787, 698, 758

[56] References Cited

U.S. PATENT DOCUMENTS 5,347,162  9/1994  Pasch ....................... 257/773

FOREIGN PATENT DOCUMENTS 4-51057  8/1992  Japan .

Primary Examiner—Tom Thomas
Assistant Examiner—David B. Hardy
Attorney, Agent, or Firm—Sughrue,Mion,Zinn,Macpeak & Seas, PLLC

[57] ABSTRACT

A device module with a circuit chip and a print-circuit substrate on which a pattern of grooves is formed by selective etching. A liquid sealing material is in the space between the circuit chip and the surface of the substrate, fixing the circuit chip on the surface of the substrate. The circuit chip has a plurality of electrodes arranged in a first pattern, and the substrate has a plurality of connection terminals arranged in the first pattern within a chip mounting area on a surface thereof. Each of the grooves passes between two adjacent connection terminals through the chip mounting area, and both ends of each groove protrudes from the periphery of the chip mounting area. After the circuit chip is placed on the chip mounting area with the respective electrodes corresponding to the connection terminals, a liquid sealing material may be spread more easily into the space between the circuit chip and the substrate by the use of capillary action to provide a more reliable and efficient seal.

18 Claims, 8 Drawing Sheets

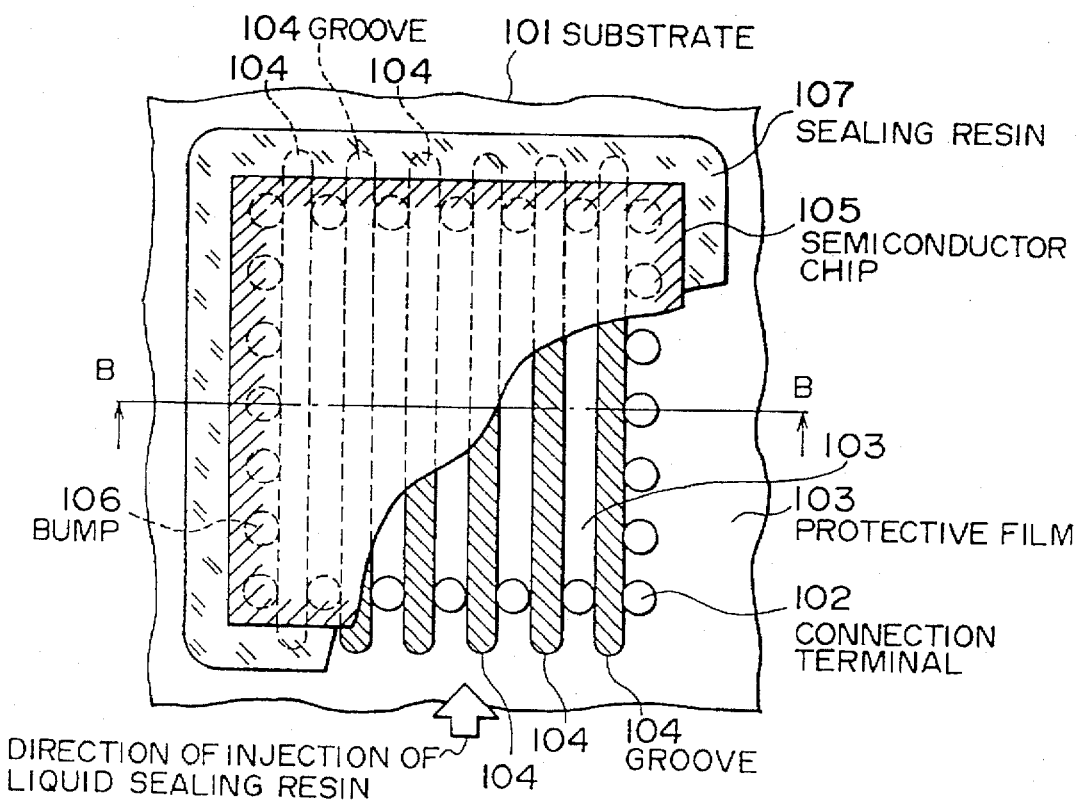
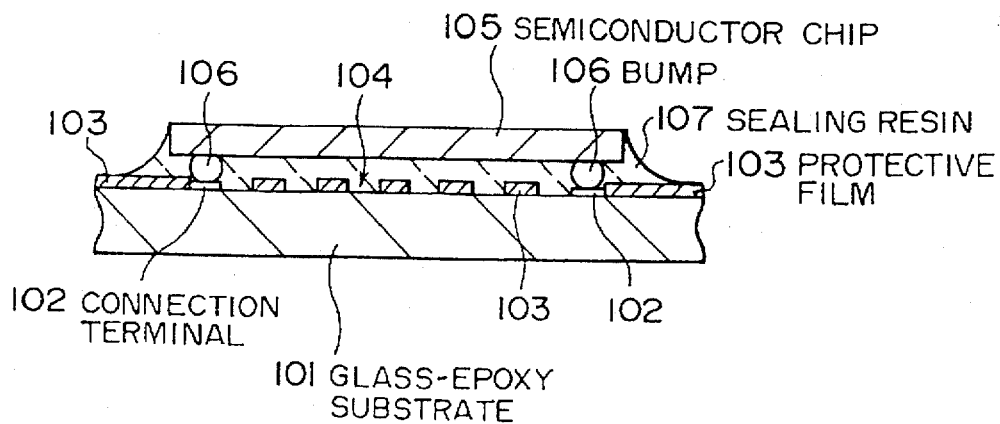

DEVICE MODULE COMPRISING A SUBSTRATE HAVING GROOVES FIXED TO CIRCUIT CHIPS WITH IMPROVED SEALING CHARACTERISTICS

BACKGROUND OF THE INVENTION

1. Field of the Invention

The present invention relates to a method of manufacturing a device module in which at least one semiconductor chip is mounted on a substrate, and in particular, to a method for fixing the semiconductor chip on the substrate by means of a sealing material.

2. Description of the Related Art

As the development of large-scale integrated circuit (LSI) technology has been made, it is an increasingly important problem to improve the packaging density on a printed circuit board. As a method for improving the packaging density, attention has focused on a multichip module in which a plurality of LSI chips are mounted on a substrate. However, as the number of connection electrodes of a LSI chip is increased, it is more difficult to mount it on the substrate. Therefore, a method of connecting such a semiconductor chip to the circuit substrate with high efficiency and reliability is strongly requested.

A module structure in which the semiconductor chip is joined with the circuit substrate by a sealing resin is disclosed in Japanese Patent examined Publication No. 4-51057. The structural outline of this module is shown in FIGS. 1A and 1B. A plurality of connection terminals 2 are formed on the surface of an insulation substrate 1 and surfaces other than the connection terminals 2 are covered with a protective film 3. These connection terminals 2 are formed in a predetermined pattern of locations corresponding to bumps 4 provided in a semiconductor chip 5, respectively. When the semiconductor chip 5 is mounted at a fixed position on the insulation substrate 1, the semiconductor chip 5 is electrically connected with the connection terminals 2 on the insulation substrate 1 by bump-bonding. After that, a liquid thermosetting resin is injected into the space between the insulation substrate 1 and the semiconductor chip 5. When heated, the sealing resin hardens and the semiconductor chip 5 is connected to the insulation substrate 1 by means of the hardened resin 7.

However, when the space between the semiconductor chip 5 and the substrate 1 is as narrow as about 40 micrometers, such a conventional method causes the following problems. Since a filler having particles of about 30-micron diameter is included in a liquid sealing resin, such a filler clogs the narrow space, preventing the liquid sealing resin from flowing freely and sufficiently. In addition, the nonuniform flow of the sealing resin might cause bubbles in the sealing resin. Therefore, void is likely to be formed in the sealing resin 6, resulting in reduced sealing strength and long-period reliability.

Moreover, in cases where the semiconductor chip is temporarily fixed on the substrate before the liquid sealing resin is injected into the space, the temporary fixing resin formed at the center of the chip prevents the liquid sealing resin from flowing to the back side thereof. Therefore, there also remains the problem such that void is formed in the sealing region.

SUMMARY OF THE INVENTION

An object of the present invention is to provide a method of producing a device module, which improves the reliability of fixing a circuit substrate and a semiconductor chip.

Another object of the present invention is to provide a method of fixing a semiconductor chip on a circuit substrate by uniformly spreading a liquid sealing material into a space between the chip and the substrate before setting.

According to the present invention, at least one circuit chip is placed on the surface of a print-circuit substrate on which a pattern of grooves is formed by selective etching. A liquid sealing material is spread into the space between the circuit chip and the surface of the substrate, and then is hardened to fix the circuit chip on the surface of the substrate. More specifically, the circuit chip has a plurality of electrodes arranged in a first pattern, and the substrate has a plurality of connection terminals arranged in the first pattern within a chip mounting area on a surface thereof. The grooves of a second pattern are formed on the substrate, each groove passing between two adjacent connection terminals through the chip mounting area, and both ends of each groove protruding from a periphery of the chip mounting area. After placing the circuit chip on the chip mounting area of the substrate with the respective electrodes corresponding to the connection terminals, a liquid sealing material is spread into a space between the circuit chip and the substrate, and then the liquid sealing material filling the space is hardened.

The liquid sealing material can be spread by capillarity. More specifically, the liquid sealing material is spread into the space when the liquid sealing material is put on one side of the chip area from which the grooves protrudes. The liquid sealing material can be also spread by pressing. More specifically, the liquid sealing material is put at a center area of the chip mounting area on the substrate. After the chip is placed on the chip mounting area with the respective electrodes corresponding to the connection terminals, the circuit chip is pressed against the substrate to spread the liquid sealing material to the space between the circuit chip and the substrate.

The pattern of the grooves is preferably comprised of a plurality of parallel line grooves extending from one side to the opposite side of the chip mounting area and each parallel line groove passing between the two adjacent connection terminals. Another pattern of the grooves is comprised of a plurality of line grooves radially extending from a corner to opposite sides of the chip mounting area and each line groove passing between the two adjacent connection terminals.

BRIEF DESCRIPTION OF THE DRAWINGS

FIG. 2A is a plan view partially broken away of a multichip module according to a first embodiment of the present invention;

FIG. 2B is a cross-sectional view taken in the line B—B of FIG. 2A;

DETAILED DESCRIPTION OF THE PREFERRED EMBODIMENTS

Figure 1A:
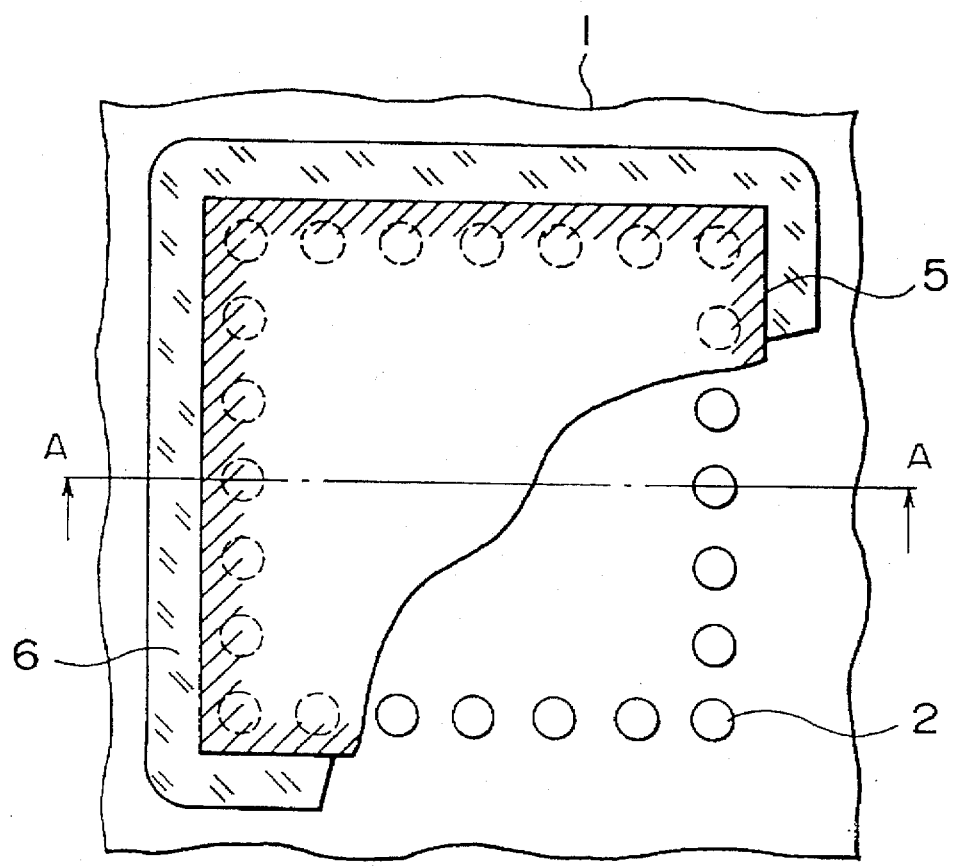
FIG. 1A is a plan view partially broken away of an example of a conventional semiconductor chip module.
Figure 1B:
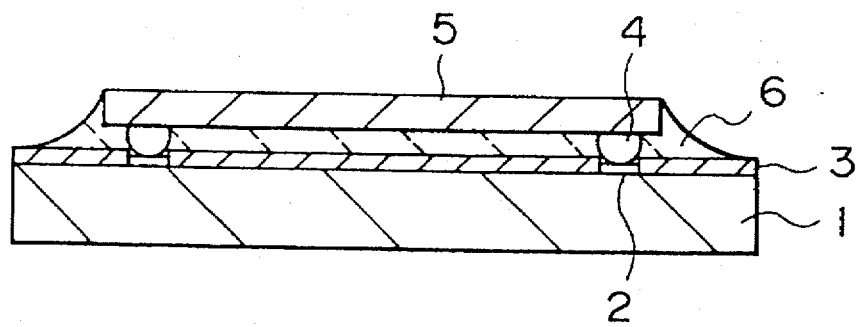
FIG. 1B is a cross-sectional view taken in the line A—A of FIG. 1A.

As illustrated in FIGS. 2A and 2B, a device module according to a first embodiment of the present invention is comprised of a circuit substrate 101, at least one semiconductor chip 105 and a sealing resin 107. The circuit substrate 101 is provided with a print circuit thereon as well as a plurality of connection terminals 102 of the print circuit in a square pattern of locations within a chip mounting area on the surface thereof. The respective bumps 106 of the semiconductor chip 105 are electrically connected to the connection terminals 102 of the substrate 101 by bump-bonding. The semiconductor chip 105 is fixed on the substrate 101 by means of the sealing resin 107.

The substrate 101 is further provided with a protective film 103 and a plurality of line grooves 104 thereon. The line grooves 104 are formed by selectively etching the protective film 103. More specifically, the line grooves 104 are formed in parallel, each line passing between two adjacent connection terminals in each of the opposite sides of the square pattern of the connection terminals 102. In addition, the line grooves 104 is longer than the chip mounting area, in other words, each line groove protruding from the periphery of the chip mounting area. After the semiconductor chip 105 is mounted on the substrate 101 such that the respective bumps correspond to the connection terminals 102, a liquid thermosetting sealing resin is injected from the one side of the chip mounting area from which the grooves protrude into the space between the substrate 101 and the semiconductor chip 105. Since the line grooves exist in the space, the liquid resin easily flows through the line grooves into the whole space. After the space is filled with the liquid resin, the resin is set by heating to fix the chip 105 and the substrate 101. The manufacturing procedure of this embodiment will be explained in detail hereinafter referring to FIGS. 3A–3D.

Figure 3A:
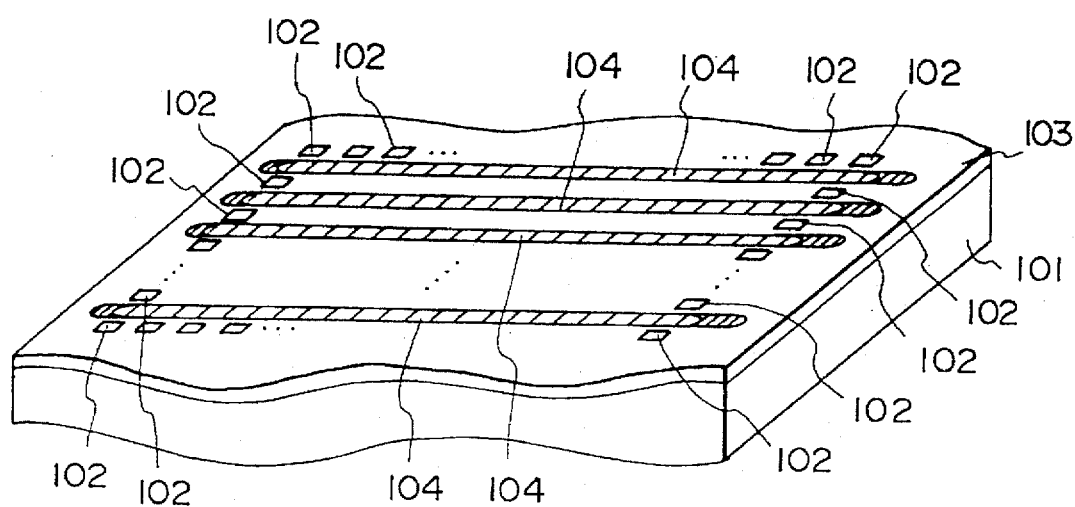
FIGS. 3A–3D are schematic perspective views showing an example of the flow of manufacturing the multichip module of FIGS. 2A and 2B.

As shown in FIG. 3A, a plurality of connection terminals 102 are arranged in the periphery of the chip mounting area on the glass epoxy substrate 101 of 0.5 mm thick in the square pattern of pitch 150–200 μm. The insulating protective film 103 of 10–15 μm thick is formed on the substrate 101. For instance, this protective film 103 can use a solder resist film or an etching resist film. The connection terminals 102 are exposed and the parallel line grooves 104 are formed by selectively etching the protective film 103. These line grooves 104 are located respectively between adjacent connection terminals 102. In addition, the length of each line groove 104 is formed longer than that of the square array pattern of the connection terminals 102. In cases where the connection terminals 102, each being 100–120 μm square, are of 150–200 μm pitch, each of the line grooves is 0.1–0.05 mm width.

On the other hand, the semiconductor chip 105 is provided with a plurality of electrodes which have the same pattern of locations as the connection terminals 102 of substrate 101. The respective electrodes have the bumps 106 each having about 80 μm in diameter comprising solder, gold or copper.

Figure 3B:
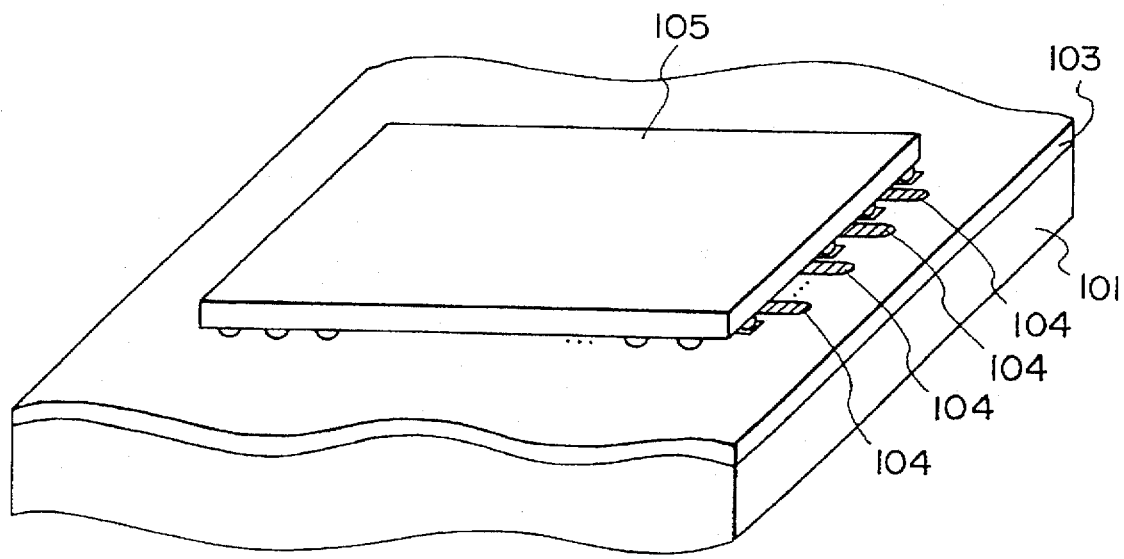

As shown in FIG. 3B, the semiconductor chip 105 is mounted on the substrate 101. The bumps 106 of the semiconductor chip 105 are connected with the connection terminals 102 of the substrate 101, respectively, by well-known bump-bonding. Since the diameter of the bumps 106 is about 80 μm, the space between the lower side of the semiconductor chip 105 and the substrate 101 is about 50–65 μm in the grooves 104. In addition, both ends of each line groove 104 protrudes from the periphery of the semiconductor chip 105.

Figure 3C:
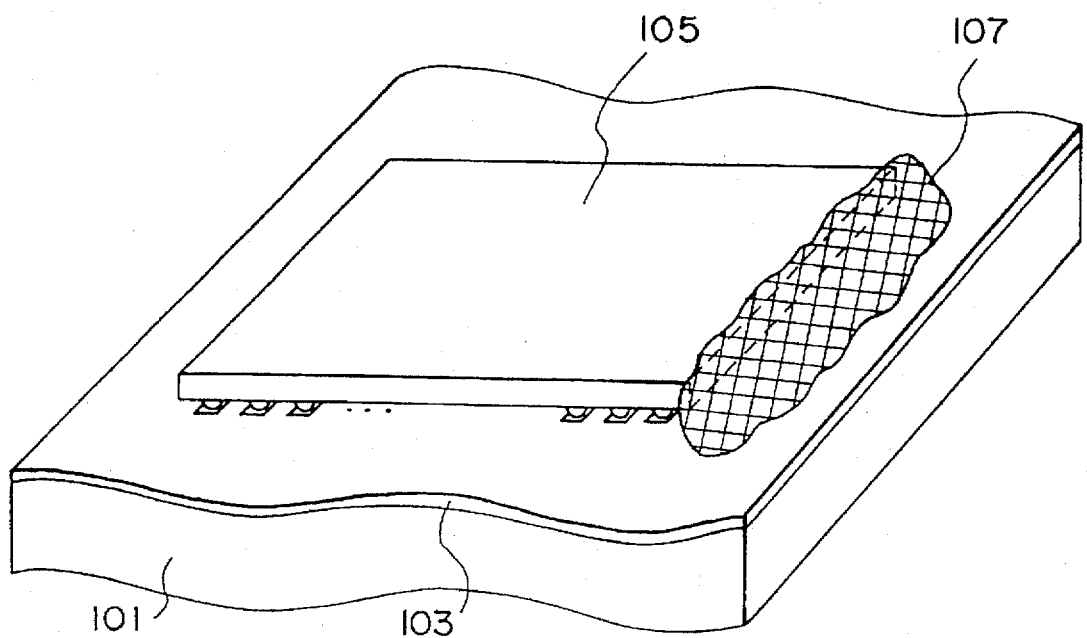

Subsequently, as shown in FIG. 3C, a liquid resin is put on the side from which the line grooves 104 protrude. The liquid resin is a thermosetting resin which contains a filler of average particle diameter 15 μm (maximum particle diameter 30 μm) such as silica. The space between the semiconductor chip 105 and the substrate 101 is about 50–65 μm in the portions of line grooves 104. Therefore, the liquid sealing resin uniformly flows into the entire space between the semiconductor chip 105 and the substrate 101 by capillarity.

Figure 3D:
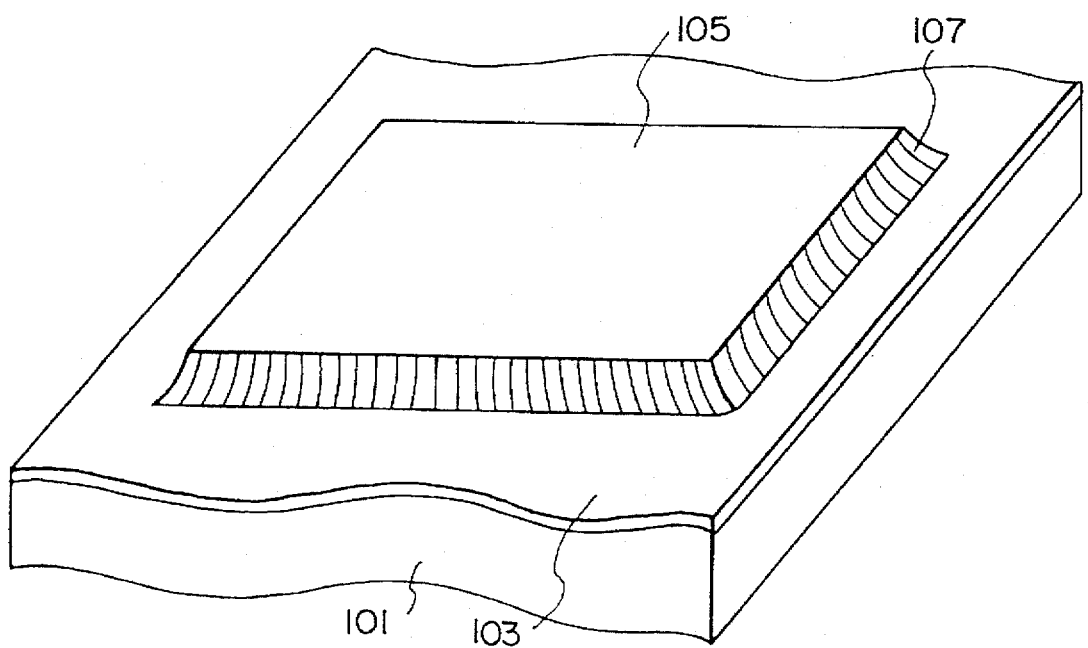

Finally, as shown in FIG. 3D, heating causes the liquid sealing resin to be hardened to form the sealing resin 107 filling the space. Thus, the connection terminals 102 and the bumps 106 are sealed and the semiconductor chip 105 is fixed to the substrate 101 by the hardened sealing resin 107. Since the liquid sealing resin flows smoothly in the line grooves formed on the substrate 101, the liquid resin uniformly spreads out the space between the semiconductor chip 105 and the substrate 101 without clogging nor causing bubbles.

Figure 7:
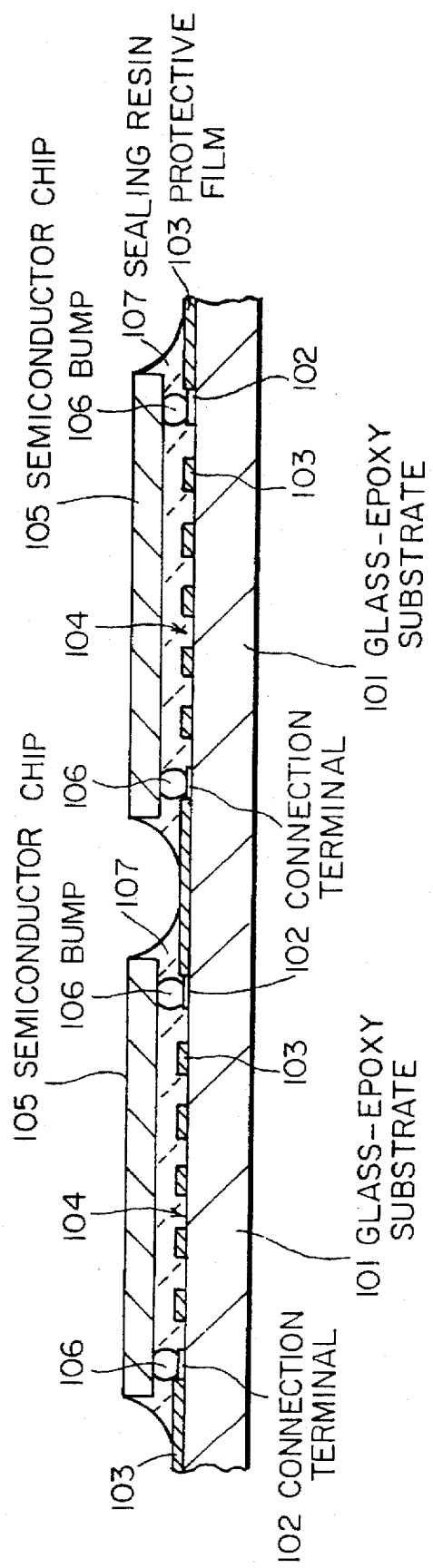
FIG. 7 is a cross-sectional view of a device showing a plurality of semiconductor chips.

FIG. 7 shows multichip module having a plurality of semiconductor chips easily formed by repeating the steps as shown in FIGS. 3A–3D.

Figure 4A:
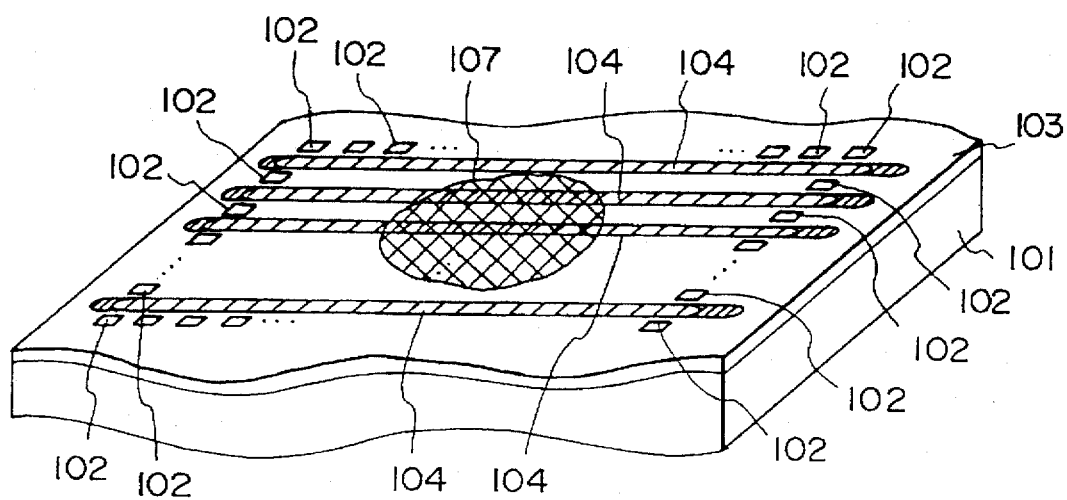
FIGS. 4A and 4B are schematic perspective views showing another example of the flow of manufacturing the multichip module of FIGS. 2A and 2B.
Figure 4B:
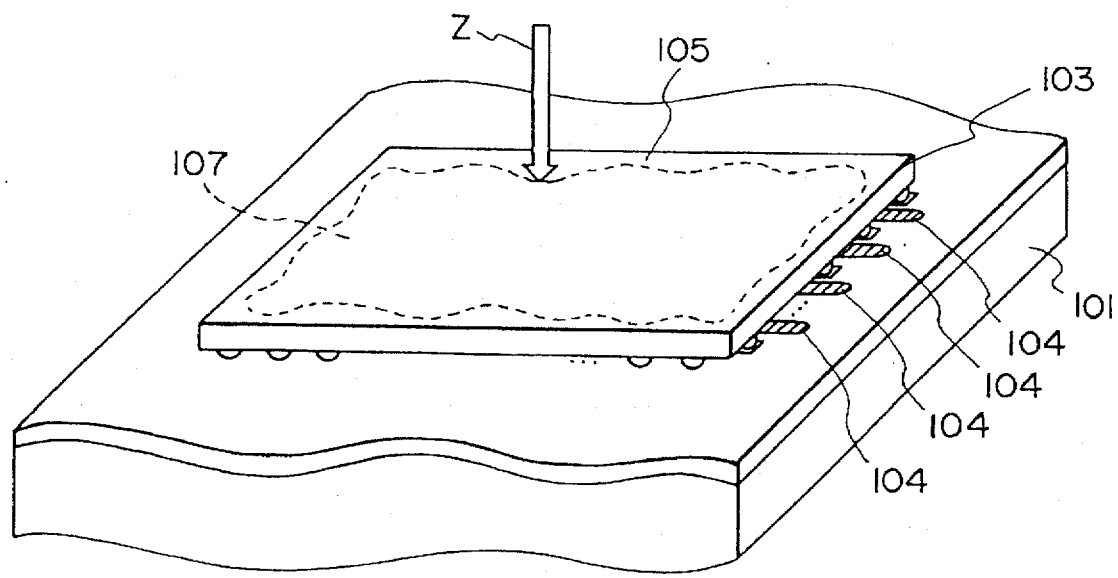

FIGS. 4A and 4B show a second embodiment of the present invention. As shown in FIG. 4A, the connection terminals 102, the prospective film 103, and the line grooves 104 are provided on the circuit substrate 101, which is the same as the first embodiment as shown in FIG. 3A. The line grooves 104 are formed in the pattern of parallel lines each passing between two adjacent connection terminals. A sealing resin whose viscosity is higher than that of the first embodiment is put on the central area of the substrate 101.

Subsequently, as shown in FIG. 4B, the semiconductor chip 105 is mounted on the substrate 101 such that the respective bumps 106 correspond to the connection terminals 102 of the substrate 101. When the semiconductor chip 105 is pressed against the substrate 101 (direction of arrow Z), the sealing resin 107 of relatively high viscosity uniformly spreads along the line grooves 104 on the substrate 101 and uniformly fills the space between the chip 105 and the substrate 101.

Finally, the sealing resin 107 which has filled the space between semiconductor chip 105 and substrate 101 hardens by heating. Thus, the bumps 106 and the connection terminals 102 are sealed and the semiconductor chip 105 is fixed to the substrate 101 by the hardened sealing resin 107.

Note that the materials and dimensions used in the embodiment are the same as in the first embodiment except that the viscosity of the liquid sealing resin put on the substrate 101 is relatively high.

Figure 5A:
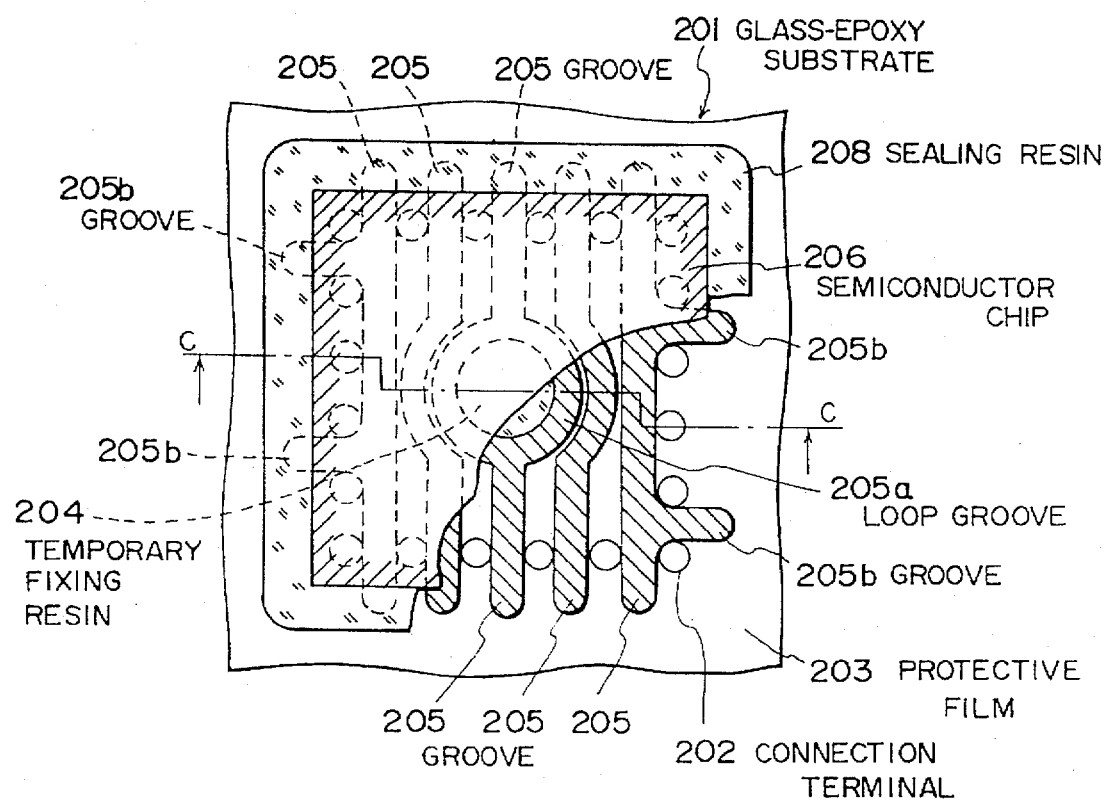
FIG. 5A is a plan view partially broken away of a multichip module according to a second embodiment of the present invention.
Figure 5B:
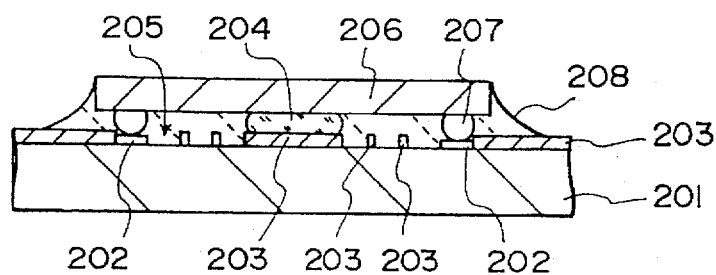
FIG. 5B is a cross-sectional view taken in the line C—C of FIG. 5A.

FIGS. 5A and 5B show a third embodiment of this invention. This embodiment employs the procedure such that the semiconductor chip is temporarily fixed to the substrate 101 before it is fixed by the sealing resin. A semiconductor device according to this embodiment is comprised of the circuit substrate 201, a semiconductor chip 206, and a sealing resin 208. As shown in FIG. 5a, a plurality of connection terminals 202, a protective film 203, a temporary fixing resin 204 and grooves 205 are provided on the circuit substrate 201. The grooves 205 are formed in a predetermined pattern by etching the areas of the protective film 203 other than the connection terminals 202 and the temporary fixing resin 204. The grooves 205 include a loop 205a formed around the temporary fixing resin 204 and several additional grooves 205b extending in a direction at right angles to the direction of the length of the grooves 205. The loop 205a is joined to the central groove at the opposite locations thereof. The additional grooves 205b are arranged at a predetermined intervals and are joined to the outermost grooves as shown in FIG. 5A. Some grooves 205 in proximity to the loop 205a are also curved.

The semiconductor chip 206 is mounted on the substrate 201 with the bumps 207 corresponding to the connection terminals 202 of the substrate 201, and then is temporarily fixed to the substrate 201 by the temporary fixing resin 204. After that, the liquid thermosetting sealing resin is injected into the space between the substrate 201 and the semiconductor chip 206 as described in the first embodiment shown in FIGS. 3C and 3D. That is, the liquid sealing resin uniformly fills the entire space between the semiconductor chip 206 and the substrate 201 by capillarity.

Since the grooves 205 include the loop 205a formed around the temporary fixing resin 204, the liquid sealing resin easily flows to the back of the temporary fixing resin 204. Therefore, after the liquid sealing resin hardens by heating, neither bubbles nor voids remain in the hardened sealing resin 208. Moreover, the additional grooves 205b cause the liquid sealing resin to uniformly and rapidly fill the entire space between the chip 206 and the substrate 201.

It should be noted that, in the case of the first embodiment as shown in FIGS. 2A and 2B, such additional grooves joined to the outermost grooves of the grooves 104 may be employed to obtain the similar advantages. The materials and dimensions of elements used in the third embodiment are the same as in the first embodiment except for the temporary fixing resin 204.

Figure 6:
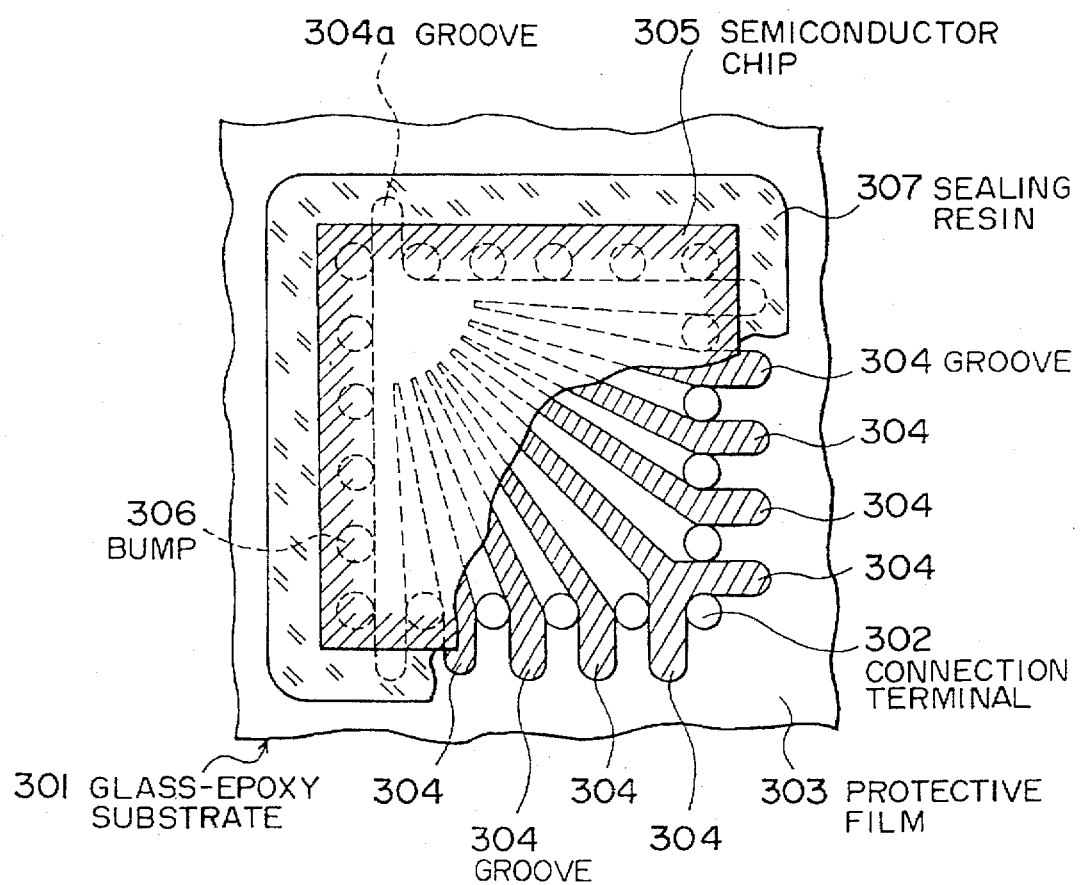
FIG. 6 is a plan view partially broken away of a multichip module according to a third embodiment of the present invention.

FIG. 6 shows a fourth embodiment of the present invention. The semiconductor device according to this embodiment is comprised of a circuit substrate 301, a semiconductor chip 305 connected with connection terminals 302 of the substrate 301 by bump-bonding, and a sealing resin 307 injected between the substrate 301 and the chip 305 to fix them.

The circuit substrate 301 is provided with a plurality of connection terminals 302 and a protective film 303 having grooves 304 thereon. The grooves 304 are formed in a predetermined pattern by selectively etching the protective film 303. The semiconductor chip 305 is mounted on the substrate 301 with the respective bumps 306 corresponding to the connection terminals 302. And, they are connected by the thermosetting sealing resin 307 which is hardened by heating after a liquid sealing resin has filled the space between the substrate 301 and the semiconductor chip 305. The grooves 304 are radially extended from a groove 304a located at one corner of the semiconductor chip 305. Such a pattern of the grooves 304 allows the liquid sealing resin to flow from the groove 304a into the entire space between the chip 304 and the substrate 301. More specifically, the injected liquid sealing resin spreads by capillarity along the grooves 304 from one corner to the entire area under the chip 305. As a result, the space between the substrate 301 and the semiconductor chip 305 is uniformly filled with the liquid sealing resin. When heated, the liquid sealing resin is hardened to fix the chip 305 on the substrate 301. Therefore, in cases where the inlet of the liquid sealing resin is restricted since other mounted parts are overcrowded, a uniform sealing resin without voids can be easily obtained.

It is apparent that the loop groove 205a provided around the temporary fixing resin 204 as shown in FIG. 5A can be applied to the substrate 301 having the groove pattern as shown in FIG. 6.

The multichip module manufactured according to the present invention has a broadened bonding area between the sealing resin and the circuit substrate since the grooves are formed on the surface of the substrate. Therefore, the reinforced bonding strength with the sealing resin can be obtained. Additionally, in cases where the circuit substrate has a different thermal coefficient of expansion from the chip, a temperature change causes a difference in the amount of expansion and contraction between them, which stresses the bump joints. According to the present invention, this stress can be eased and the tolerance to the temperature change can be improved.

What is claimed is:

1. A device module, comprising:
   a) a circuit chip having a plurality of electrodes arranged in a first predetermined pattern:
   b) a substrate having a plurality of connection terminals arranged in said first predetermined pattern within a predetermined chip area on a surface of said substrate;
   c) a plurality of grooves formed in a second predetermined pattern on said surface of said substrate, each said groove passing between two adjacent connection terminals of said connection terminals through said chip area, and both ends of each said groove protruding from a periphery of said chip area wherein said circuit chip is placed on said chip area of said surface of said substrate with said electrodes corresponding to said connection terminals, respectively; and
   d) a liquid sealing material spread into a space between said circuit chip and said surface of said substrate wherein said liquid sealing material hardens and fills said space.

2. A device module according to claim 1, wherein said second pattern of said grooves comprises a plurality of parallel line grooves extending from one side to the opposite side of said chip area and each parallel line groove passing between said two adjacent connection terminals.

3. A device module according to claim 2, comprising a plurality of semiconductor chips.

4. A device module according to claim 1, wherein said second pattern of said grooves comprises a plurality of line grooves radially extending from a corner to opposite sides of said chip area and each line groove passing between said two adjacent connection terminals.

5. A device module according to claim 4, comprising a plurality of semiconductor chips.

6. A device module according to claim 1, wherein said substrate further comprises a protective film on said surface of said substrate and said grooves are formed by selectively etching said protective film.

7. A device module according to claim 6, wherein said protective film comprises a solder resist.

8. A device module according to claim 7, comprising a plurality of semiconductor chips.

9. A device module according to claim 6, wherein said protective film comprises an etching resist.

10. A device module according to claim 9, comprising a plurality of semiconductor chips.

11. A device module according to claim 6, wherein said second pattern of said grooves comprises a plurality of line grooves radially extending from a corner to opposite sides of said chip area and each line groove passing between said two adjacent connection terminals.

12. A device module according to claim 11, comprising a plurality of semiconductor chips.

13. A device module according to claim 6, comprising a plurality of semiconductor chips.

14. A device module according to claim 6, wherein said second pattern of said grooves comprises a plurality of parallel line grooves extending from one side to the opposite side of said chip area and each parallel line groove passing between said two adjacent connection terminals.

15. A device module according to claim 14, comprising a plurality of semiconductor chips.

16. A device module according to claim 1, wherein said substrate further comprises a temporary connecting area at center area of said predetermined chip area on a surface of said substrate and said grooves further comprise a loop groove which is formed around said temporary connecting area and is joined to a central groove of said grooves.

17. A device module according to claim 16, comprising a plurality of semiconductor chips.

18. A device module according to claim 1, comprising a plurality of semiconductor chips.

* * * * *